(12) United States Patent
Kanzawa et al.

(10) Patent No.: US 6,838,395 B1
(45) Date of Patent: Jan. 4, 2005

(54) METHOD FOR FABRICATING A SEMICONDUCTOR CRYSTAL

(75) Inventors: Yoshihiko Kanzawa, Yawata (JP); Teruhito Ohnishi, Hirakata (JP); Ken Idota, Moriguchi (JP); Tohru Saitoh, Ibaraki (JP); Akira Asai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/330,080

(22) Filed: Dec. 30, 2002

(51) Int. Cl.$^7$ ................................. H01L 21/31
(52) U.S. Cl. ................. 438/781; 438/783; 438/470; 438/477; 438/520; 438/933
(58) Field of Search .............. 438/781, 783–784, 438/470, 520, 933, 471, 477

(56) References Cited

U.S. PATENT DOCUMENTS

| | | | | |
|---|---|---|---|---|
| 4,292,093 A | * | 9/1981 | Ownby et al. | 134/1.3 |
| 4,368,083 A | * | 1/1983 | Bruel et al. | 438/536 |
| 4,655,849 A | * | 4/1987 | Schachameyer et al. | 117/103 |
| 5,024,968 A | * | 6/1991 | Engelsberg | 438/597 |
| 5,151,135 A | * | 9/1992 | Magee et al. | 134/1 |
| 5,286,658 A | * | 2/1994 | Shirakawa et al. | 438/5 |
| 5,445,679 A | * | 8/1995 | Hansen et al. | 134/1 |
| 6,242,368 B1 | * | 6/2001 | Holmer et al. | 438/795 |
| 6,251,751 B1 | | 6/2001 | Chu et al. | |
| 6,348,369 B1 | * | 2/2002 | Kusumoto et al. | 438/166 |
| 2002/0025626 A1 | * | 2/2002 | Hattangady et al. | 438/240 |
| 2002/0052072 A1 | * | 5/2002 | Hirose | 438/200 |
| 2002/0179003 A1 | * | 12/2002 | Iida et al. | 117/19 |
| 2003/0042480 A1 | * | 3/2003 | Hirose | 257/19 |

FOREIGN PATENT DOCUMENTS

| | | |
|---|---|---|
| JP | 11-284065 | 10/1999 |
| JP | 2001-93900 | 4/2001 |
| JP | 2001-196317 | 7/2001 |

* cited by examiner

*Primary Examiner*—Matthew Smith
*Assistant Examiner*—Renzo N Rocchegian
(74) *Attorney, Agent, or Firm*—McDermott Will & Emery LLP

(57) ABSTRACT

A method for fabricating a semiconductor crystal that has a first step for forming a semiconductor crystal layer (202) that contains carbon atoms and at least one kind of Group IV element other than carbon on a substrate (201), a second step for adding an impurity that is capable of reacting with oxygen to the semiconductor crystal layer (202), and a third step for removing the carbon atoms contained in the semiconductor crystal layer (202) by reacting the carbon with the impurity. This method makes it possible to fabricate a semiconductor crystal substrate in which the concentration of interstitial carbon atoms is satisfactorily reduced, thus resulting in excellent electrical properties when the substrate is applied to a semiconductor device.

13 Claims, 5 Drawing Sheets

METHOD FOR FABRICATING A SEMICONDUCTOR CRYSTAL

TECHNICAL FIELD

The present invention relates to a method for fabricating a semiconductor crystal, and to a semiconductor crystal substrate. More specifically, the present invention relates to a method for fabricating a semiconductor crystal that is composed of a carbon-containing Group IV element.

BACKGROUND ART

Recently, semiconductor crystals composed of Group IV elements for use in high-speed semiconductor devices have attracted widespread public attention. Among these, research and development related to semiconductors composed of Group IV elements containing carbon (SiGeC,) Si:C (Si crystal containing a few atomic percent substitutional C atoms), Ge:C (Ge crystal containing a few atomic percent substitutional C atoms), etc.) has been actively conducted in recent years (for example, Japanese Unexamined Patent Publication Nos. 2001-196317, 2001-93900, 1999-284065 (Specification of U.S. Pat. No. 6,251,751). This is because these crystals have the following excellent properties.

(1) First, the advantages of the Si:C crystal will be explained. The Si:C crystal has a smaller lattice constant than the Si crystal because the carbon atom is smaller than the silicon atom. Therefore, when epitaxially grown on an Si substrate, Si:C crystals become strained, because they receive tensile stress toward the in-plane direction of the substrate. In strained Si:C crystals, so-called intervalley scattering, which is one of the scattering mechanisms of conduction electrons, is reduced compared to that of bulk Si crystals. The reduced scattering enables Si:C crystals that have been epitaxially grown on an Si substrate to obtain greater mobility than that of bulk Si crystals. Therefore, by applying a heterostructure composed of Si:C crystals and Si crystals, it is possible to achieve a device that operates at higher speed than is possible using only bulk Si crystals.

(2) Next, the SiGeC crystal, which can be considered as an improvement of the SiGe crystal, will be explained.

The SiGe crystal has a larger lattice constant than the Si crystal. Therefore, when an SiGe crystal has been epitaxially grown on an Si substrate, it is subjected to an extremely large compressive stress, generating strain. This compressive strain limits the film thickness to the so-called critical film thickness (the upper limit of film thickness that can be deposited without dislocation), and may lead to relaxation accompanied by crystal defects (dislocations) when the SiGe crystal is additionally subjected to heat treatment. Furthermore, in a heterostructure composed of Si and SiGe crystals, band offset appears only on the valence band of the SiGe crystal. Therefore, when an MOS transistor with an SiGe crystal channel is fabricated, only a p-channel transistor can be obtained.

However, since carbon has a smaller atomic radius than Si or Ge, adding carbon atoms to an SiGe crystal reduces the lattice constant of the crystal and compensates the strain. The critical film thickness can thus be made thicker than that of the SiGe crystal. Furthermore, it is also possible to reduce the amount of strain accumulated in the crystal, thereby raising the thermal resistance of the crystal. From the viewpoint of its application to devices, in a heterostructure composed of SiGeC and Si crystals, when the concentrations of Ge and C are increased (Ge: dozens of %, C: several % or greater), band offsets appear both on the valence band and conduction band of the SiGeC crystal. In this case, carrier trapping occurs in both the conduction band and valence band. Therefore, the use of SiGeC crystal as a channel material is advantageous in that not only p-channel MOS transistors but also n-channel MOS transistors can be fabricated.

As described above, the Si:C crystal and SiGeC crystal have excellent properties, and the additional effects obtained by adding carbon atoms thereto become more distinctive by increasing the concentration of carbon thereof. For example, if the carbon concentration of the Si:C crystal becomes higher, a significant effect on the prevention of scattering can be expected.

However, it is essentially difficult to dissolve a carbon atom in Si or Ge, and therefore a high-quality crystal with a high carbon concentration cannot be readily fabricated. Furthermore, a high carbon concentration in the crystal leads to the following problems.

Carbon atoms tend to be incorporated not only into substitutional lattice sites but also into interstitial lattice sites. The interstitial carbon atoms tend to form a trap with a positive or negative charge in the crystal. In fabricating transistors, having such traps causes the recombination or scattering of carriers, thereby degrading the properties of the device.

In order to obtain high-quality Si:C or SiGeC crystals having a low interstitial carbon concentration, methods known as CVD (Chemical Vapor Deposition) and MBE (Molecular Beam Epitaxy) have been heretofore employed. In these methods, in order to minimize the number of interstitial carbon atoms, various modifications have been made to the crystal growing method (lowering the growth temperature or increasing the total pressure of the source gas).

However, even when these techniques are employed, if the carbon concentration increases to a certain degree, there is a tendency for carbon atoms to be inserted between the lattice positions. Therefore, it was difficult to fabricate a Group IV element semiconductor wherein all the carbon atoms were incorporated into substitutional lattice sites. As a result, the interstitial carbon atoms cause the recombination or scattering of the carriers as described above. Therefore, applying such crystals to a semiconductor device poses a problem because they have a significant effect on the electrical properties.

DISCLOSURE OF THE INVENTION

The present invention aims to solve the problems described above and provides a method for fabricating semiconductor crystals wherein the substitutional carbon concentration is satisfactorily reduced in Group IV element semiconductor crystals.

The above-descried object of the present invention can be achieved by a method for fabricating semiconductor crystals that comprises a first step of forming a semiconductor crystal layer containing carbon and at least one of the Group IV elements other than carbon on a substrate, a second step of adding an impurity that can react with carbon to the semiconductor crystal layer, and a third step of removing the carbon contained in the semiconductor crystal layer by a reaction between the carbon and the impurity.

BEST MODE FOR CARRYING OUT THE INVENTION

Hereinafter, embodiments of the present invention will be explained with reference to the accompanying drawings. In order to get a clear picture of the problems of the known methods, the present inventors first conducted the following experiments.

Figure 1:
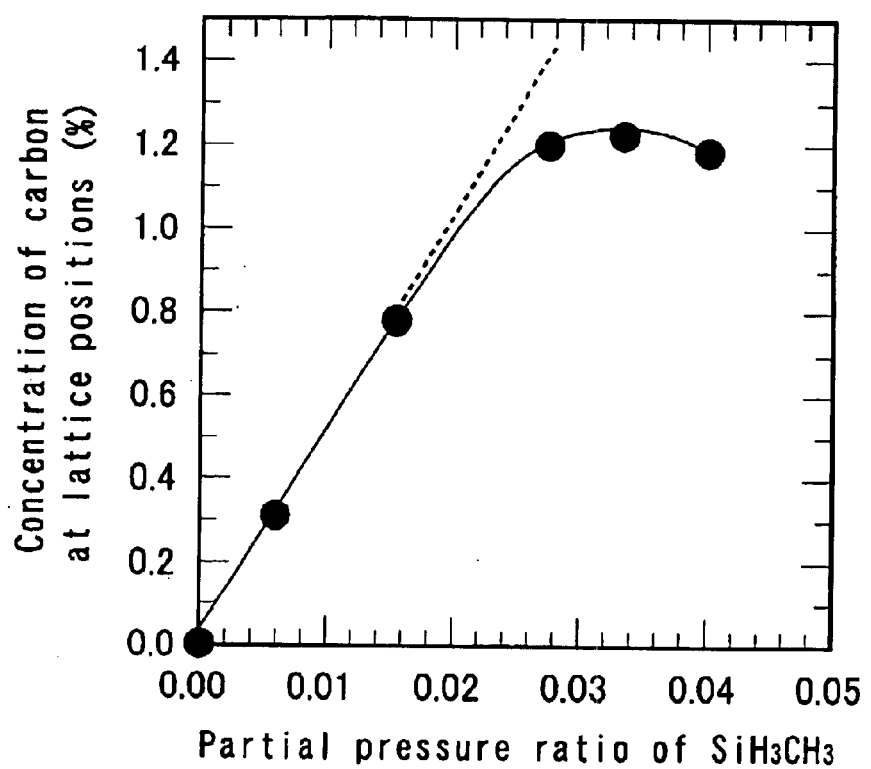
FIG. 1 shows the relationship between the source gas ($SiH_3CH_3$ gas) partial pressure ratio and the concentration of carbon atoms at the lattice positions of the semiconductor crystal (SiGeC crystal).

By employing the ultra high vacuum chemical vapor deposition (UHV-CVD) method, which is a known crystal growing method, alloy semiconductor crystals (SiGeC) composed of carbon-containing Group IV elements were obtained. Disilane ($Si_2H_6$) was used as the source gas for Si, germane ($GeH_4$) was used as the source gas for Ge, and monomethylsilane ($SiH_3CH_3$) was used as the source gas for C. The pressures of the $Si_2H_6$ and $GeH_4$ were set in such a manner that the Ge concentration became approximately 25%, and, while keeping these gas pressures constant, only the pressure of the $SiH_3CH_3$ gas was gradually raised. Then, changes in the concentration of carbon atoms at the lattice positions were observed. FIG. 1 shows the results. The measurement of the concentration of carbon atoms at the lattice positions was conducted by the x-ray diffraction method.

In FIG. 1, the vertical axis indicates the concentration of substitutional carbon atoms and the horizontal axis indicates the proportion of $SiH_3CH_3$ gas pressure relative to the total source gas pressure (i.e., $SiH_3CH_3$ gas pressure/($Si_2H_6$ gas pressure+$GeH_4$ gas pressure+$SiH_3CH_3$ gas pressure)). As shown by the solid line in FIG. 1, until the proportion of $SiH_3CH_3$ gas pressure reaches approximately 0.02 (substitutional carbon concentration of approximately 1%), the carbon concentration at the lattice positions linearly increases in proportion to the pressure of the $SiH_3CH_3$ gas. However, when the proportion of the $SiH_3CH_3$ gas pressure exceeds approximately 0.02, the increase rate of the substitutional carbon concentration tends to gradually decrease and saturates around 1.3%. On the other hand, as shown by the dashed line in FIG. 1, it is widely known that the total concentration of the carbon atoms contained in the crystal increases in proportion to the $SiH_3CH_3$ gas pressure ratio. Therefore, it is believed that the variance of the concentration of carbon atoms at the lattice positions between that shown by the solid line and that shown by the dashed line indicates that an excess of carbon (mainly carbon atoms other than those at the lattice positions) has been inserted into the crystal.

From such experimental results and the like, it became clear that when the substitutional carbon concentration of carbon-containing Group IV element semiconductor crystals falls in the range from 0.5 to 2.0%, carbon atoms exist in interstitial sites, and particularly when the substitutional carbon concentration is in the range from 1.0 to 1.3%, the concentration of interstitial carbon atoms becomes high and the removal of these carbon atoms becomes necessary. A method for fabricating semiconductor crystals, such as SiGeC crystals, in which the interstitial carbon concentration is kept in a low range will be explained below.

(1) First Embodiment

Figure 2:
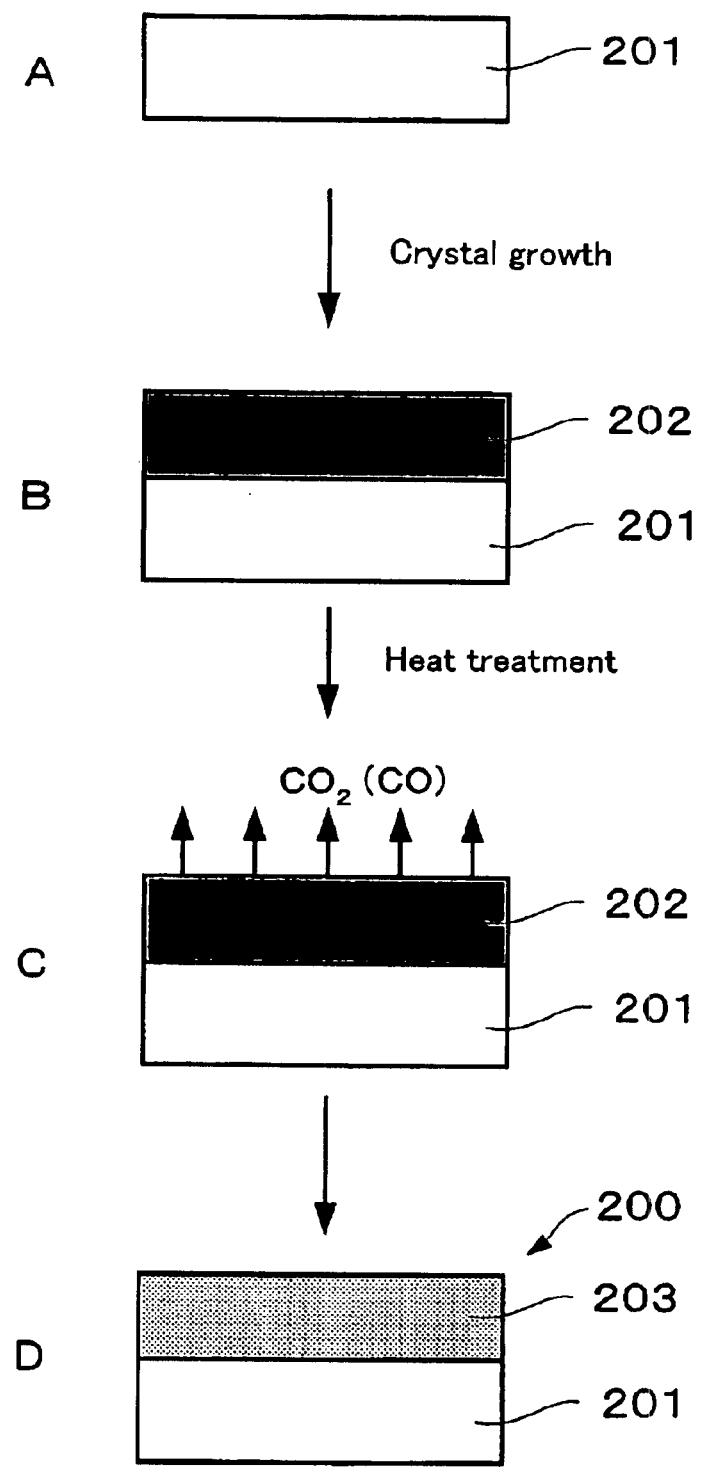
FIGS. 2a–2d are cross-sectional views showing the fabricating steps of the semiconductor crystal according to the first embodiment of the present invention.

FIG. 2 is a cross-sectional view showing the fabricating steps of the semiconductor crystal according to the first embodiment of the present invention. First of all, as shown in FIG. 2A, an Si wafer 201 is cleaned and placed in a crystal growth chamber for use as a substrate. In the present embodiment, as a crystal growth chamber, an ultra high vacuum CVD (chemical vapor deposition) chamber (UHV-CVD chamber) was used. The ultra high vacuum CVD (chemical vapor deposition) method (UHV-CVD method) using such a chamber is a method for fabricating semiconductor crystals in which the crystal is grown under an ultra high vacuum backpressure of $10^{-9}$ Torr (1 Torr=133.322 Pa) or less.

In the present embodiment, after placing the Si wafer 201 in the crystal growth chamber, the chamber is evacuated until the pressure becomes $2\times10^{-9}$ Torr. Then, the substrate is heated to 850° C. in a hydrogen gas atmosphere so that all foreign matter on the surface of the Si wafer 201 is removed and a clean Si surface is exposed.

Then, the temperature of the Si wafer 201 placed in the crystal growth chamber is lowered to 490° C. and the source gas is supplied therein. In the present embodiment, Si, Ge, and C source gases are used. Examples of Si source gas include $SiH_4$, $Si_2H_6$, $SiH_2Cl_2$, etc. Examples of Ge source gas include $GeH_4$, $C(GeH_3)_4$, etc. Examples of C source gas include $CH_4$, $C_2H_6$, $SiH_3CH_3$, etc., and alcohols, such as $CH_3OH$, $C_2H_5OH$, etc. Note that $C(GeH_3)_4$, which is used as a Ge source gas, also serves as a C source gas. Then, SiGeC crystals begin growing on the Si wafer 201. The pressures of the source gases at the time of crystal growth are, for example, $7\times10^{-5}$ Torr for $Si_2H_6$ gas, $2.3\times10^{-4}$ Torr for $GeH_4$ gas, and $9\times10^{-6}$ Torr for $SiH_3CH_3$ gas.

In the present embodiment, $O_2$ gas is supplied simultaneously with the supply of the source gas. The partial pressure of $O_2$ gas is, for example, $3\times10^{-9}$ Torr.

When the crystal is grown under the conditions described above for 15 minutes, as shown in FIG. 2B, a semiconductor crystal layer 202 composed of SiGeC crystals is formed on the Si wafer 201. The semiconductor crystal layer 202 has a thickness of approximately 100 nm, wherein the crystals thereof contain 25% Ge and have a carbon concentration at the lattice positions of 1.2%. The semiconductor crystal layer 202 contains carbon atoms that have been incorporated into interstitial lattice sites has a concentration of interstitial carbon atoms of approximately 0.1 to 0.2%. Furthermore, by supplying $O_2$ gas, oxygen, which is an impurity that can react with interstitial carbon atoms, is added to the semiconductor crystal layer 202, wherein the oxygen concentration is approximately $1\times10^{19}/cm^3$.

As the next step, the supply of the source gas is completely stopped, the temperature of the Si wafer 201 is raised to 900° C., and the wafer is heated for one minute. Accordingly, as shown in FIG. 2C, the carbon atoms contained in the crystals of the semiconductor crystal layer 202 bond to oxygen to form carbon dioxide ($CO_2$) or carbon monoxide (CO) and evaporate from the crystals. The interstitial carbon atoms are in an unstable condition because they have a weaker bond to the other atoms in the crystals than the substitutional carbon atoms. Therefore, it is believed that they more preferentially bond to oxygen atoms than the substitutional carbon atoms and dissociate from the crystals in the form of $CO_2$ or CO. By following such a process, as shown in FIG. 2D, the excess carbon atoms that exist in the interstitial lattice sites are removed, and, as a result, the semiconductor crystal layer 202 becomes an improved semiconductor crystal layer 203. A semiconductor crystal substrate 200, comprising the improved semiconductor crystal layer 203 formed onto the Si wafer 201 substrate is completed, wherein carbon atoms between the lattice positions have been substantially removed.

According to the above-described method for fabricating semiconductor crystals of the present embodiment, by a reaction between the carbon atoms and the oxygen that is added as an impurity and the subsequent heat treatment, it is possible to remove the interstitial carbon atoms that result when inserting carbon atoms into the lattice positions of the semiconductor crystal layer. Thereby, the electrical properties of a device employing this semiconductor crystal can be satisfactorily enhanced.

In the present embodiment, the concentration of the oxygen added to the semiconductor crystal layer 203 is set at $1 \times 10^{19}/cm^3$; however, the concentration thereof is not limited to this. Nonetheless, adding an unduly large quantity of oxygen is not preferable, because $SiO_2$ may form in the crystals when heat treatment is conducted after the crystal growth. Therefore, it is preferable that the oxygen concentration be set at the same level as the carbon concentration in the semiconductor crystal layer 203, or lower than that. Specifically, it can be in the range from approximately $5 \times 10^{18}$ to $1 \times 10^{20}/cm^3$ (5E18 to 1E20/$cm^3$).

Figure 3:
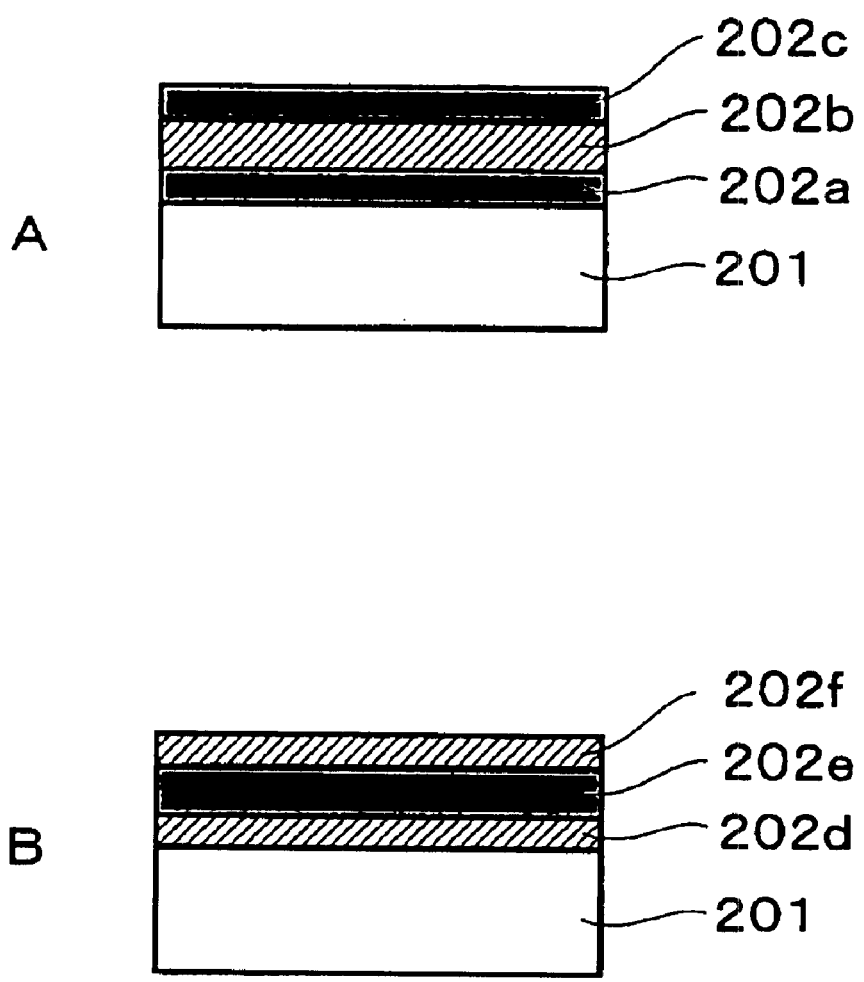
FIGS. 3a–3b are cross-sectional views illustrating a modified example of a method for fabricating the semiconductor crystal according to the first embodiment of the present invention.

In the present embodiment, oxygen is added to the entire semiconductor crystal layer 203. However, since oxygen and carbon are dispersed in the crystals by heat treatment, adding oxygen to only a portion of the semiconductor crystal layer 203 can achieve almost the same effect as that of the present embodiment. For example, on the Si wafer 201 substrate, a semiconductor crystal layer 202a with oxygen added, a semiconductor crystal layer 202b without oxygen, and a semiconductor crystal layer 202c with oxygen added can be layered in this order, as shown in FIG. 3A, followed by heat treatment. This allows the formation of a semiconductor crystal layer from which an excess of oxygen is removed. Alternatively, it is also possible to form a semiconductor crystal layer from which an excess of oxygen is removed, by layering a semiconductor crystal layer 202d without oxygen, a semiconductor crystal layer 202e with oxygen added, and a semiconductor crystal layer 202f without oxygen on the Si wafer 201 substrate in this order, as shown in FIG. 3B, and conducting heat treatment.

Such a layered structure of semiconductor crystal layers can be readily obtained by adjusting the timing for supplying and stopping the $O_2$ gas in the source gas.

As described above, when oxygen is added to only a portion of the semiconductor crystal layer, the concentration of the added oxygen can be lowered. Therefore, the adverse effects resulting from the formation of $SiO_2$ in the crystals can be reduced.

(2) Second Embodiment

Figure 4:
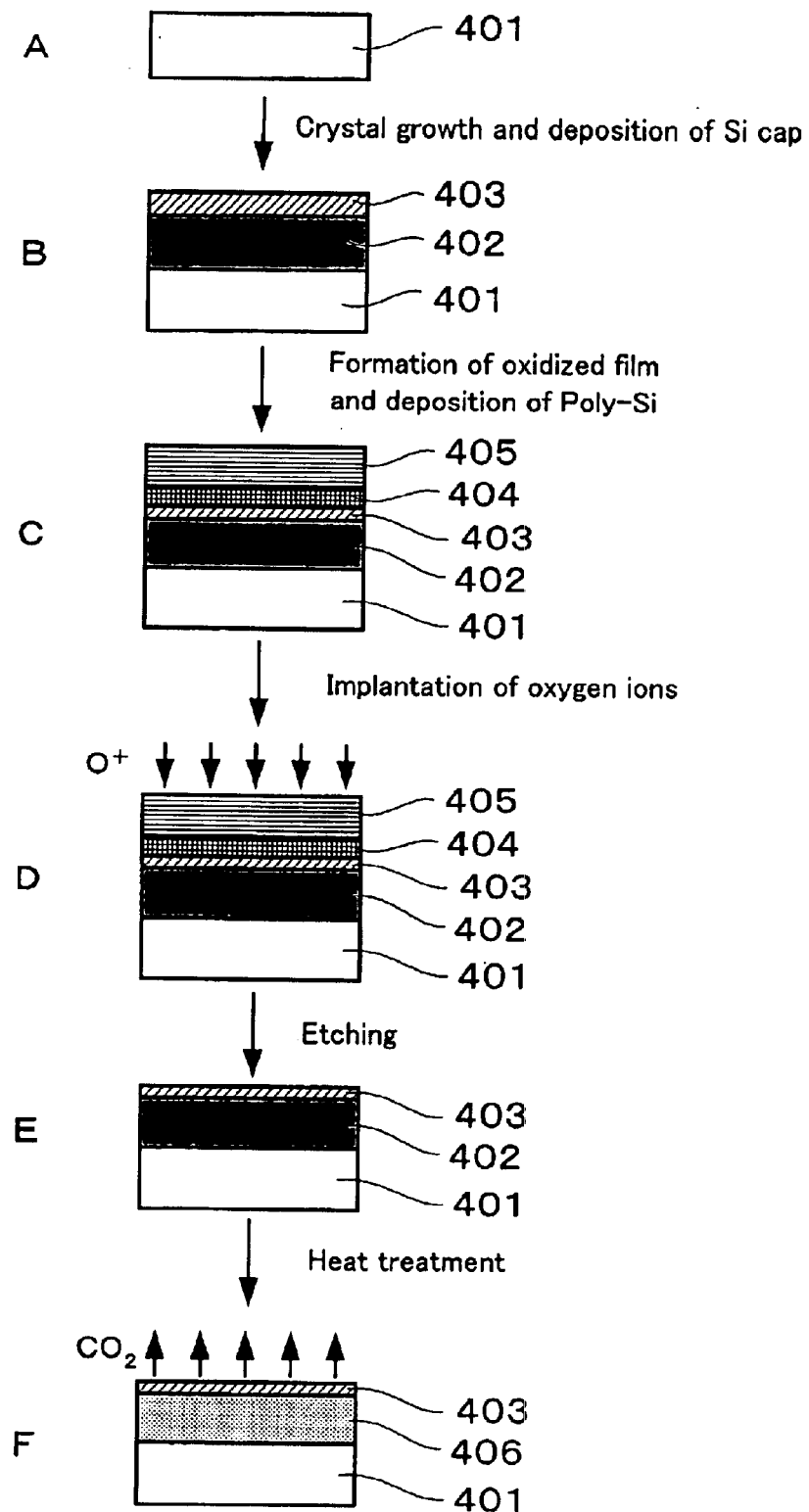
FIGS. 4a–4f are cross-sectional views showing the fabricating steps of the semiconductor crystal according to the second embodiment of the present invention.

FIG. 4 is a cross-sectional view showing the fabricating steps of the semiconductor crystal according to the second embodiment of the present invention. In the first embodiment, oxygen is added to the semiconductor crystal layer by simultaneously supplying $O_2$ gas with the source gas. However, in the present embodiment, oxygen is added after obtaining a semiconductor crystal layer. The details of the present embodiment will be explained below.

Fist of all, as shown in FIG. 4A, an Si wafer 401 substrate is cleaned and placed in a crystal growth chamber. The present embodiment also uses an ultra high vacuum CVD (chemical vapor deposition) chamber (UHV-CVD chamber) as a crystal growth chamber, and, similar to the first embodiment, foreign matter on the surface of the Si wafer 401 is removed and a clean Si surface is exposed.

The temperature of the Si wafer 401 is then lowered to 490° C. and the source gas is supplied, whereupon SiGeC crystal growth begins. The same gases as in the first embodiment can be used as the source gas, and, for example, the pressure of each gas is adjusted such that $7 \times 10^{-5}$ Torr for $Si_2H_6$ gas, $2.3 \times 10^{-4}$ Torr for $GeH_4$ gas, and $9 \times 10^{-6}$ Torr for $SiH_3CH_3$. Note that, in the present embodiment, $O_2$ gas is not supplied at this stage.

When the crystal is grown for 15 minutes under these conditions, as shown in FIG. 4B, a semiconductor crystal layer 402 is formed on the Si wafer 401. The semiconductor crystal layer 402 has a thickness of approximately 100 nm, a crystal structure containing 25% Ge, and a substitutional carbon concentration of 1.2%. The interstitial carbon concentration thereof is approximately 0.1 to 0.2%.

Then, the supply of $GeH_4$ gas and $SiH_3CH_3$ gas is stopped, only $Si_2H_6$ gas is supplied, and the pressure is adjusted to $7 \times 10^{-5}$ Torr. Thereafter, the temperature of the Si wafer is raised to 600° C. and maintained for one minute. Thereby, an Si cap 403 having a thickness of 10 nm is formed on the semiconductor crystal layer 402 (see FIG. 4B).

The resulting sample is taken out from the crystal growth chamber and a portion of the Si cap 403 is subjected to thermal oxidation. The thermal oxidation can be conducted, for example, by pyro-oxidation. In other words, a sample is placed in an electric furnace at 900° C., oxygen and hydrogen are introduced at the flow rate of 9,000 sccm and 8,000 sccm, respectively. With approximately 5 minutes of oxidation, the surface of the Si cap 403 is oxidized to a depth of approximately 5 nm, forming an oxidized film 404 as shown in FIG. 4C.

Next, the sample is placed in the vacuum CVD chamber and, while maintaining $SiH_4$ in an atmosphere with a pressure of approximately 0.1 Torr at 600° C. for approximately 50 minutes, a poly-Si layer 405 is deposited thereon so that the thickness thereof becomes approximately 300 nm (see FIG. 4C).

The sample obtained in the above procedure is then placed into an ion implantation chamber and subjected to ion implantation in the manner shown in FIG. 4D. It is preferable that ion implantation be conducted in such a manner that the oxygen concentration becomes highest around the center of the thickness direction of the semiconductor crystal layer 402. Suitable implantation conditions, for example, are a dosage of $1 \times 10^{14}/cm^2$ and energy of 180 keV. In this case, the oxygen concentration around the center of the semiconductor crystal layer 402 becomes approximately $1 \times 10^{19}/cm^3$.

After implanting the oxygen ions, as shown in FIG. 4E, the poly-Si layer 405 is removed by dry etching and the oxidized film 404 is removed by wet etching.

Then, the resulting sample is placed in a thermal annealing chamber and heated to 900° C. for one minute. The thermal annealing is conducted in an oxygen-free atmosphere so that the sample is not oxidized, for example, under an $H_2$ atmosphere, $N_2$ atmosphere, Ar atmosphere, etc. As shown in FIG. 4F, the thermal oxidation causes the excess carbon atoms in the crystals to bond to oxygen and to evaporate from the crystals in the form of carbon dioxide ($CO_2$). The excess carbon atoms existing between the lattice positions are thus substantially removed, and the semiconductor crystal layer 402 becomes an improved semiconductor crystal layer 406. This makes it possible to form a semiconductor crystal substrate 400 onto the Si wafer 401 substrate with an improved semiconductor crystal layer 406 from which the excess carbon atoms between the lattice positions are substantially removed.

In the present embodiment, the oxidized film 404 and poly-Si layer 405 are formed above the semiconductor crystal layer 402, and the oxidized film 404 and poly-Si layer 405 are removed after oxygen ions are implanted as an impurity. By forming such dummy layers (in the present embodiment, the oxidized film 404 and poly-Si layer 405) before the ion implantation, the concentration peak of the implanted oxygen ions can be readily adjusted to the desired depth in the semiconductor crystal layer 402 (for example, around the center of the thickness direction). In other words, the thickness and the structure of the dummy layers can be appropriately selected depending on the conditions of the oxygen ion implantation so as to achieve effective ion implantation, and therefore the specific structure is not limited to that of the present embodiment.

It is not preferable to add an unduly large quantity of oxygen because $SiO_2$ may form in the crystals when heat treatment is conducted. Therefore, it is preferable that the oxygen concentration be set at the same level as the carbon concentration in the semiconductor crystal layer 403, or lower than that. Specifically, the oxygen concentration added to the semiconductor crystal layer can be in the range from approximately 5E18 to $1E20/cm^3$.

(3) Preferable Temperature for Heat Treatment

Next, the following experiment was carried out in order to examine the preferable temperature range for the heat treatment, which removes the excess carbon atoms from the SiGeC layer, in the first and second embodiments.

The structure of the sample used in the experiment was a crystal (concentration of Ge: 25%, concentration of C: 1%, and concentration of O: $1\times10^{19}/cm^3$) having a 10 nm of Si layer and 100 nm of SiGeC layer deposited on an Si substrate. Note that this SiGeC layer was formed in the same manner as explained in the first embodiment. In other words, the substrate was maintained at 490° C. in the UHV-CVD chamber, and, while simultaneously supplying source gases at the pressures approximately $7\times10^{-5}$ Torr for $Si_2H_6$ gas, approximately $2.3\times10^{-4}$ Torr for $GeH_4$ gas, approximately $9\times10^{-6}$ Torr for $SiH_3CH_3$ gas, and approximately $3\times10^{-9}$ Torr for $O_2$, the crystal growth was conducted for approximately 15 minutes.

Figure 5:
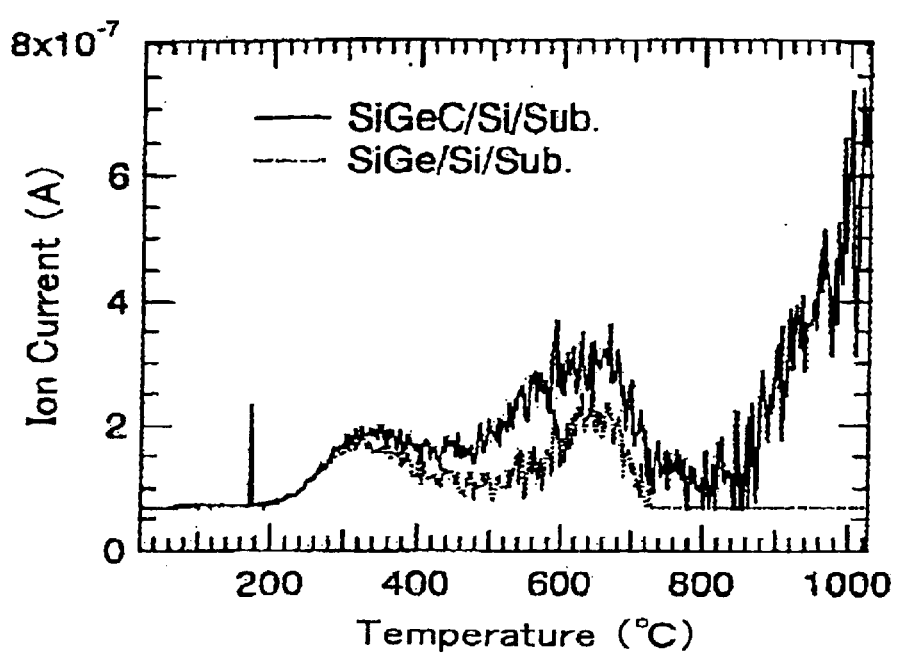
FIG. 5 shows the relationship between the heating temperature and the evaporation of $CO_2$.

In FIG. 5, the thermal desorption spectrum of the thus obtained SiGeC layer is shown by the solid line. In FIG. 5, for a comparison reason, the thermal desorption spectrum of the SiGe layer without carbon is shown by the dashed line. The sample used in this comparison was so structured that a 10 nm of Si layer was deposited on the Si substrate and a 100 nm of SiGe layer (concentration of Ge: 25%, concentration of C: 0%, and concentration of O: $1\times10^{19}/cm^3$) was deposited thereon.

Hereunder, the thermal desorption spectrum will be briefly explained. The thermal desorption spectrum is used for analyzing the kinds of substances that evaporated from a sample when the sample was heated under the ultra high vacuum atmosphere by conducting the mass spectroscopy. In the thermal desorption spectrum shown in FIG. 5, the vertical axis indicates the ion current, which increases in proportion to the evaporation of a substance that has the mass number of 44, and the horizontal axis indicates the temperature of the sample. In this experiment, the sample contains only Si, Ge, C, and O, and, among the substances obtained by combining these elements, it is believed that only $CO_2$ has the mass number of 44. Therefore, the vertical axis in FIG. 5 indicates the evaporation of $CO_2$.

As is clear from FIG. 5, both in the SiGeC layer (solid line) and the SiGe layer (dashed line), peaks appear around 350° C. and 650° C. These peaks indicate that a large quantity of the substance having the mass number of 44 has evaporated from the sample around these temperatures. This phenomenon was observed both in the SiGeC layer and the SiGe layer, and therefore it is believed that the peaks are mainly attributable to the releasing of $CO_2$ that has been absorbed on the surface of the sample.

However, when the temperature reached 700° C. or higher, the ion current strength of the SiGe layer became almost 0, on the other hand, the ion current of the SiGeC layer turned to increase from approximately 700° C., and therefore the two layers greatly differ in their tendencies. It is believed the reason that the ion current of the SiGe layer became almost 0 at 700° C. and higher that all of the absorbed $CO_2$ has released and evaporated therefrom. Therefore, in respect to the SiGeC layer, it is believed that the substance having the mass number of 44 observed at 700° C. or higher is not the $CO_2$ that has been absorbed on the surface of the sample but the $CO_2$ that has been generated in the crystals of the SiGeC layer, dispersed in the crystals, and evaporated from the surface.

From the experimental results as shown in FIG. 5, it is clear that carbon atoms can be removed from the sample by a reaction between the carbon atoms and oxygen in the crystal, by subjecting the oxygen-added semiconductor crystal layer that is composed of a carbon-containing Group IV element to heat treatment. In the crystal, carbon atoms are incorporated into substitutional and interstitial sites; however, it is believed that the interstitial carbon atoms are in an unstable condition because they have no strong bond to the other atoms in the crystal, and therefore they preferentially bond to oxygen compared to the substitutional carbon atoms and released form the crystal in the form of $CO_2$. Therefore, it is clear that, by adding oxygen to the SiGeC layer and conducting heat treatment, the excess carbon atoms incorporated into interstitial lattice sites can be effectively removed.

Furthermore, as is clear from the results shown in FIG. 5, it is preferable that the temperature of the heat treatment for removing the excess carbon atoms existing between the lattice positions be high. However, if the temperature becomes too high, the crystal structure of the SiGeC layer may collapse and silicon carbide (SiC) may be undesirably generated, and therefore the temperature is preferably in the range from 700 to 1,050° C., and more preferably in the range from 900 to 1,000° C.

In the SiGeC crystal, it is believed that not only $CO_2$ but also CO is generated; however, in the thermal desorption spectrum obtained in this experiment, generation of CO was not clearly confirmed. This is probably because the CO that has been generated in the crystal was formed into $CO_2$ by bonding to oxygen while dispersing in the crystal and, or the CO that has evaporated form the surface of the crystal was formed into $CO_2$ by bonding to the oxygen slightly left in the vacuum atmosphere.

It is also believed that the CO and $CO_2$ formed in the crystal were not only released from the surface of the SiGeC crystal as described above but also partly dispersed in the crystal. However, CO and $CO_2$ are comparatively stable molecules as they are and do not strongly bond to the elements that compose the SiGeC crystal. Therefore, as long as the interstitial carbon atoms exist in the crystal in the form of CO or $CO_2$, it is believed that they will not adversely affect the electrical properties of the device.

(4) Other Embodiments

In the embodiments described above, oxygen was used as an impurity added to a semiconductor crystal layer. However, there is no limitation as long as the impurity can be removed by the reaction with carbon atoms, and, for example, hydrogen or fluorine can be added as the impurity.

Furthermore, in the above embodiments, an example wherein the semiconductor crystal layer is formed as a SiGeC layer was explained; however, as long as it is a carbon-containing Group IV element semiconductor crystal layer (for example, SiGeC crystal, Si:C crystal, Ge:C crystal, ect.), it is possible to obtain a semiconductor crystal substrate by following the same process as in the embodiments described above and achieve the same effects.

Regarding the crystal growing method in the above embodiments, various known methods other than the UHV-CVD method, including the low-pressure CVD method, MBE method, and the like can be employed.

The temperature and time period of the heat treatment are also not limited to the examples explained in the above embodiments and can be appropriately selected in such a manner that the excess carbon atoms incorporated into interstitial lattice sites can be effectively removed.

Furthermore, in the first embodiment, crystal growth of the SiGeC crystals and the subsequent heat treatment were performed in the same crystal growth chamber; however, for example, it is also possible to once take out the substrate that has been subjected to crystal growth from the crystal growth chamber and conduct the heat treatment using a separate heat treatment chamber. Furthermore, other than the vacuum atmosphere, the heat treatment can be conducted under an $H_2$ atmosphere, $N_2$ atmosphere, Ar atmosphere, etc. It is also possible to conduct the heat treatment after thinly depositing, for example, Si crystals and the like on the semiconductor crystal layer.

In the embodiments described above, explained were the methods for removing the interstitial carbon atoms that were generated during the epitaxial growth of an SiGeC crystal (namely, the interstitial carbon atoms intrinsically generated). However, the methods for removing interstitial carbon atoms of the present invention can also be employed to remove the interstitial carbon atoms generated in the process of fabricating a device after the SiGeC crystal has been epitaxially grown (i.e., the interstitial carbon atoms extrinsically generated). For example, when the SiGeC crystal is used as the base region of a bipolar transistor and the poly-Si that has phosphorus (P) doped thereon is used as the emitter region, it becomes necessary to conduct heat treatment after depositing the phosphorus-doped poly-Si on the SiGeC crystal. In this case, interstitial silicon atoms are dispersed from the phosphorus-doped poly-Si into the SiGeC crystal region and displace carbon atoms at the lattice positions in the SiGeC crystal generating interstitial carbon atoms. In this case, it is also possible to efficiently remove interstitial carbon atoms by adding an impurity, such as oxygen that is capable of reacting with carbon, to the SiGeC crystal.

INDUSTRIAL APPLICABILITY

As described above, in respect to the Group IV element semiconductor crystal, the present invention provides a method for fabricating a semiconductor crystal in which the concentration of the interstitial carbon is satisfactorily reduced. When this crystal is applied to a semiconductor device, excellent electrical properties can be obtained.

What is claimed is:

1. A method for fabricating a semiconductor crystal comprising:
    a first step for forming a semiconductor crystal layer that contains carbon atoms and at least one kind of Group IV element other than carbon on a substrate;
    a second step for adding an impurity that is capable of reacting with carbon to the semiconductor crystal layer; and
    a third step for removing the carbon contained in the semiconductor crystal layer by reacting the carbon with the impurity;
    the second step being performed simultaneously with the first step;
    the first step comprises forming a semiconductor crystal layer by growing crystals on the substrate by using a source gas containing carbon and at least one kind of Group IV element other than carbon; and
    the second step comprises supplying a gas that contains the impurity simultaneously with the supply of the source gas.

2. The method for fabricating the semiconductor crystal according to claim 1, wherein the impurity added in the second step includes oxygen.

3. The method for fabricating the semiconductor crystal according to claim 2, wherein the concentration of oxygen added to the semiconductor crystal layer is 5E18 to 1E20/$cm^3$.

4. The method for fabricating the semiconductor crystal according to claim 1, wherein the semiconductor crystal layer is an Si:C layer, Ge:C layer, or SiGeC layer.

5. The method for fabricating the semiconductor crystal according to claim 1, wherein the concentration of the carbon atoms existing at the lattice positions in the semiconductor crystal layer is 0.5 to 2.0%.

6. The method for fabricating the semiconductor crystal according to claim 1, wherein the third step comprises a step for heating the semiconductor crystal layer with the impurity added.

7. The method for fabricating the semiconductor crystal according to claim 6, wherein the heating temperature in the third step is 700 to 1,050° C.

8. The method for fabricating the semiconductor crystal according to claim 1, wherein the carbon atoms that react with the impurity in the third step are carbon atoms mainly existing between the crystal lattice positions.

9. The method for fabricating the semiconductor crystal according to claim 1, wherein the substrate is a silicon crystal substrate.

10. The method for fabricating the semiconductor crystal according to claim 1, wherein the source gas contains a C source gas and an Si source gas and/or Ge source gas.

11. The method for fabricating the semiconductor crystal according to claim 10, wherein the C source gas contains at least one member selected from the group consisting of $CH_4$, $C_2H_6$, $SiH_3CH_3$, and alcohol; the Si source gas contains at least one member selected from the group consisting of $SiH_4$, $Si_2H_6$, and $SiH_2Cl_2$; and the Ge source gas contains at least one of $GeH_4$ and $C(GeH_3)_4$.

12. The method for fabricating the semiconductor crystal according to claim 1, wherein the gas that contains the impurity is oxygen gas.

13. The method for fabricating the semiconductor crystal according to claim 12, wherein the second step comprises supplying oxygen gas so as to add oxygen to a portion of the semiconductor crystal layer.

* * * * *

UNITED STATES PATENT AND TRADEMARK OFFICE
CERTIFICATE OF CORRECTION

PATENT NO. : 6,838,395 B1
DATED : January 4, 2005
INVENTOR(S) : Yoshihiko Kanzawa et al.

It is certified that error appears in the above-identified patent and that said Letters Patent is hereby corrected as shown below:

<u>Title page,</u>
Item [75], Inventors, change cities of residence for the first four inventors as follows:
"Yoshihiko Kanzawa, Yawata (JP)" to -- Yoshihiko Kanzawa, Kyoto (JP) --;
"Teruhito Ohnishi, Hirakata (JP)" to -- Teruhito Ohnishi, Osaka (JP) --;
"Ken Idota, Moriguchi (JP)" to -- Ken Idota, Osaka (JP) --;
"Tohru Saitoh, Ibaraki (JP)" to -- Tohru Saitoh, Osaka (JP) --.

Signed and Sealed this

Seventeenth Day of May, 2005

JON W. DUDAS
*Director of the United States Patent and Trademark Office*